(12) United States Patent
Pope et al.

(10) Patent No.: US 9,777,398 B2
(45) Date of Patent: Oct. 3, 2017

(54) PLANE ORIENTATION OF CRYSTALLINE STRUCTURES

(71) Applicant: Apple Inc., Cupertino, CA (US)

(72) Inventors: Benjamin J. Pope, Sunnyvale, CA (US); Christopher D. Prest, San Francisco, CA (US); Dale N. Memering, San Francisco, CA (US); Scott A. Meyers, Palo Alto, CA (US)

(73) Assignee: APPLE INC., Cupertino, CA (US)

( * ) Notice: Subject to any disclaimer, the term of this patent is extended or adjusted under 35 U.S.C. 154(b) by 1347 days.

(21) Appl. No.: 13/626,412

(22) Filed: Sep. 25, 2012

(65) Prior Publication Data
US 2014/0083353 A1    Mar. 27, 2014

(51) Int. Cl.
| C30B 15/36 | (2006.01) |
| B28D 5/00 | (2006.01) |
| C30B 15/34 | (2006.01) |
| C30B 29/20 | (2006.01) |

(52) U.S. Cl.
CPC ............... *C30B 15/36* (2013.01); *B28D 5/00* (2013.01); *C30B 15/34* (2013.01); *C30B 29/20* (2013.01); *Y10T 117/1044* (2015.01)

(58) Field of Classification Search
CPC combination set(s) only.
See application file for complete search history.

(56) References Cited

U.S. PATENT DOCUMENTS

| 2002/0018288 A1 | 2/2002 | Rieger | |
| 2004/0109486 A1* | 6/2004 | Kinoshita | H01S 5/32341 372/45.01 |
| 2005/0217560 A1* | 10/2005 | Tolchinsky | C30B 15/36 117/11 |
| 2008/0166951 A1* | 7/2008 | Tanikella | B24B 7/228 451/37 |
| 2009/0017263 A1* | 1/2009 | Yeates | B22D 19/04 428/167 |
| 2009/0101936 A1* | 4/2009 | Kamei | H01L 33/16 257/103 |
| 2009/0130415 A1* | 5/2009 | Mack, III | C30B 15/34 428/220 |

FOREIGN PATENT DOCUMENTS

| JP | 53-073481 A | 6/1978 |
| JP | 3601791 B2 | 10/2004 |
| JP | 4245856 B2 | 1/2009 |
| WO | 2009/009764 A1 | 1/2009 |

* cited by examiner

*Primary Examiner* — Duy Deo
*Assistant Examiner* — Erin Bergner
(74) *Attorney, Agent, or Firm* — Brownstein Hyatt Farber Schreck, LLP

(57) ABSTRACT

Systems and method for creating crystalline parts having a desired primary and secondary crystallographic orientations are provided. One embodiment may take the form of a method of manufacturing a part having a crystalline structure. The method includes melting aluminum oxide and drawing the melted aluminum oxide up a slit. Additionally, the method includes orienting the seed crystal relative to a growth apparatus such that a crystalline structure grows having a desired primary plane and a desired secondary plane orientation. Moreover, the method includes pulling the crystal as it forms to create a ribbon shaped crystalline structure and cutting a part from the crystalline structure.

16 Claims, 8 Drawing Sheets

PLANE ORIENTATION OF CRYSTALLINE STRUCTURES

TECHNICAL FIELD

The present application is directed to the manufacture of crystalline structures and, more particularly, to orienting planes of crystalline structures during growth of the crystal.

BACKGROUND

Corundum is a crystalline form of aluminum oxide and is found in various different colors, all of which are generally commonly referred to as sapphire except for red corundum which is commonly known as ruby and pinkish-orange corundum which is known as padparadscha. Transparent forms of corundum are considered precious stones or gems. Generally, corundum is extraordinarily hard with pure corundum defined to have 9.0 Mohs and, as such, is capable of scratching nearly all other minerals.

As may be appreciated, due to certain characteristics of corundum, including its hardness and transparent characteristics, among others, it may be useful in a variety of different applications. However, the same characteristics that are beneficial for particular applications commonly increase both the cost and difficulty in processing and preparing the sapphire for those applications. As such, beyond costs associated with it being a precious stone, the costs of preparing the corundum for particular uses is often prohibitive. For example, the sapphire's hardness makes cutting and polishing the material both difficult and time consuming when conventional processing techniques are implemented. Further, conventional processing tools such as cutters experience relatively rapid wear when used on corundum.

SUMMARY

Systems and method for creating crystalline parts having a desired primary and secondary crystallographic orientations are provided. One embodiment may take the form of a method of manufacturing a part having a crystalline structure. The method includes melting aluminum oxide and drawing the melted aluminum oxide up a slit. Additionally, the method includes orienting the seed crystal relative to a growth apparatus such that a crystalline structure grows having a desired primary plane and a desired secondary plane orientation. Moreover, the method includes pulling the crystal as it forms to create a ribbon shaped crystalline structure and cutting a part from the crystalline structure.

Another embodiment may take the form of a method of manufacturing sapphire parts. The method includes growing a sapphire boule and slicing the sapphire boule to create a sapphire wafer having a desired primary crystallographic orientation. The method also includes cutting a sapphire part from the wafer. The sapphire part is cut to have a desired secondary crystallographic orientation.

Yet another embodiment may take the form of a system for creating sapphire parts having a desired primary and secondary crystallographic orientations. The system includes a crucible configured to melt aluminum oxide and a slit extending downward into the crucible configured to draw melted aluminum oxide through capillary action. The system also includes a die positioned at the top of the crucible and over the slit to shape a sapphire crystal as it is formed and a mechanism for holding an oriented seed crystal relative to the die so that the seed crystal contacts the melted aluminum oxide, the mechanism further configured to pull a sapphire ribbon from the die.

While multiple embodiments are disclosed, still other embodiments of the present invention will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive.

DETAILED DESCRIPTION

Figure 1:
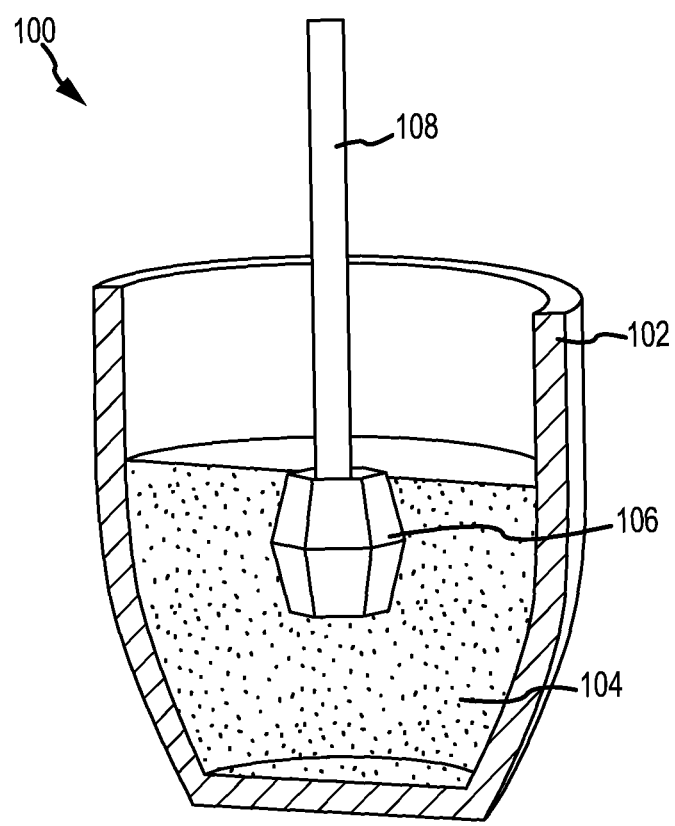
FIG. 1 illustrates a first example process for sapphire growth.

For sapphire to be used as an enclosure material in electronic devices, high and consistent strength is desired in order to ensure reliability and avoid fracture in use event like a drop. Whereas glass and metals tend to be isotropic in their properties, meaning that their implementation does not need to take into account the orientation of the part and material relative to the product, sapphire is anisotropic due to its crystal structure.

The anisotropic nature may be utilized to take advantage of differences in the properties between planes for specific applications. Specifically, when implementing sapphire as an enclosure material, such as for a cover glass for a smart phone, or tablet computer, the orientation of the part surface with respect to a specific crystal plane may be defined, as well as the orientation of the edges of the part with respect to other crystallographic planes. For example, a high strength part for a given implementation may be defined as having a primary crystallographic orientation of A Plane (relative to a primary part surface) with a secondary crystallographic orientation of 45° off from the C Plane (relative to a long edge of the part). By fine tuning the orientation of the sapphire part, the alignment of low energy fracture planes with the highest stress directions of the part during loading may be avoided. Further, the fracture plane can instead be aligned so that they experience low stress. In testing, statistically significant strength improvements over other secondary orientations have been seen and much more uniform strength is expected over parts with a given primary orientation and random secondary orientations.

Another reason to control the secondary orientation of the sapphire part is for optical reasons. Since liquid crystal displays utilize polarizers, the birefringence of the sapphire can impact the appearance of the display when view through polarized sunglasses. As such the secondary orientation may be selected to help avoid the sapphire having an impact on the appearance of the display.

As such, certain embodiments may take the form of a method that includes specifying the primary and secondary orientations of the crystal prior to growth of the crystal to help increase the yield of the grown crystal. For example, in an edge-defined film-fed growth (EFG) process, the seed crystal may be oriented relative to the growth die such that the surface of the EFG ribbon results has an A-plane crystallographic orientation, while the edges of the ribbon may be oriented at some angle, such as 45°, to the M-plane so that utilization of the grown ribbon would be maximized. This optimization applies to most growth methods. It should be appreciated that various different combinations of crystallographic orientations may be implemented. As such, each of various possible combinations of different primary and secondary crystallographic orientations of the A-plane, C-plane, M-plane and R-plane may be created.

Generally, the process of growing sapphire starts with alumina powder that is subjected to a densification process to form densified alumina (or crackle). The alumina is melted and a seed crystal is inserted into the molten alumina. The molten alumina is then cooled with precisely controlled temperatures and the crystal is formed on the seed. Additional processing steps such as cutting and polishing the formed crystal may be performed, as well as annealing steps to help "heal" the crystalline structure that may have formed during growth or subsequent processing, as mentioned above.

Some common growth methods include Kyropoulos, Verneuil, Czochralski, flux, hydrothermal, vertical horizontal gradient freezing ("VHGF"), Stepanov (i.e., EFG), and Bridgman (i.e., horizontal moving growth). The Kyropoulos, Verneuil, Czochralski, flux, and hydrothermal processes generate a sapphire boule, whereas the EFG, VHGF and horizontal moving growth processes generate sapphire members having continuous cross-sections. It should be appreciated that although specific examples described herein may refer to a particular process for sapphire growth the examples are not intended to be limiting. As such, the present techniques, systems and methods may be used in conjunction with each of the various sapphire growth processes.

Turning to the drawings and referring initially to FIG. 1A, a system 100 for performing the Kyropoulos process is illustrated by a cross-sectional view of a crucible 102. The crucible 102 holds the alumina melt 104 and a seed crystal 106 is inserted into the crucible 102 with a support rod 108. Crystallization of the molten alumina 104 occurs on the seed crystal 106 following the orientation of the seed crystal. The seed, crystal, therefore is oriented in a manner to help optimize yield of the crystal according to a desired primary plane orientation as well as an orientation of the secondary plane, as discussed in greater detail below.

Figure 2:
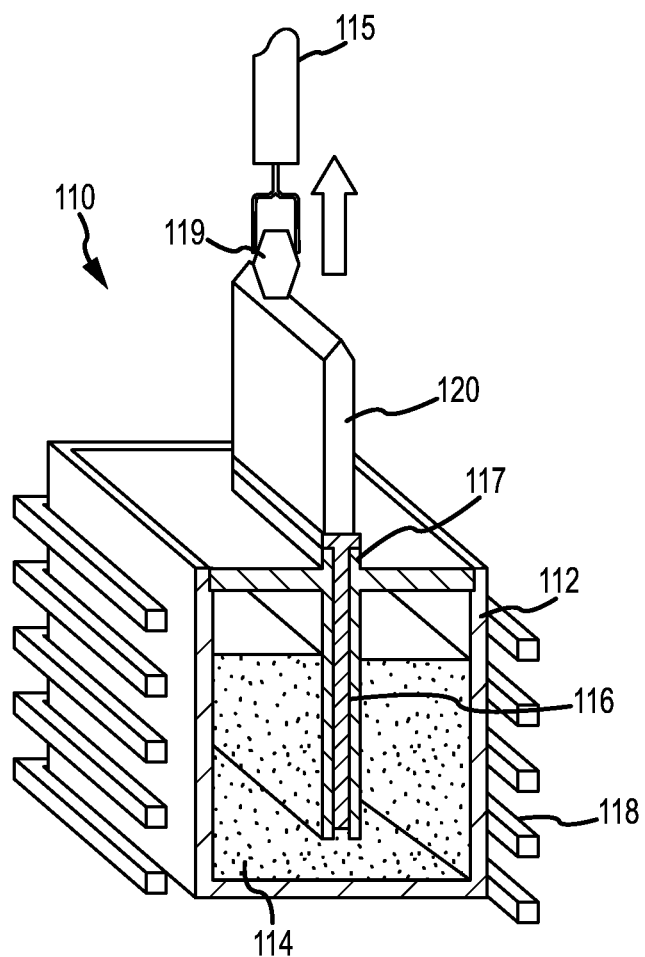
FIG. 2 illustrates a second example process for sapphire growth.

A system 110 for growing sapphire according to the EFG process is illustrated in FIG. 2 with a cross-sectional view of another crucible 112. Again, the crucible 112 holds the alumina melt 114. The crucible 112 may be heated by heating elements 118 which surround the crucible. The molten alumina 114 is drawn up a melt supply slit of a die 116 which may take the form of two close, parallel plates which draw the molten alumina up through capillary action. A die tip 117 may be positioned at or near a boundary formed by the crucible and the die 116. The die tip 117 or top geometry of the plates determine the output geometry of the sapphire as it is formed.

A mechanism 115 for holding the seed crystal 119 may be provided. In some embodiments, the mechanism 115 may be configured to reorient the seed crystal, for example by rotating the orientation of the seed crystal 119 relative to the die. The mechanism 115 may bring the seed crystal 119 into contact with the molten alumina which propagates crystalline growth and sapphire 120 may then draw the crystal upwardly out of the crucible 112. The sapphire is formed in the shape of the die 117 and the sapphire crystalline structure follows the existing orientation of the seed. In some embodiments, the die may be configured to approximate the size and shape of the part being created. For example, the die may be 5-10 percent larger than the cross-section of the part being formed. The orientation of the crystal is selected to achieve a desired primary plane orientation and a desired secondary orientation of the crystal.

Figure 3:
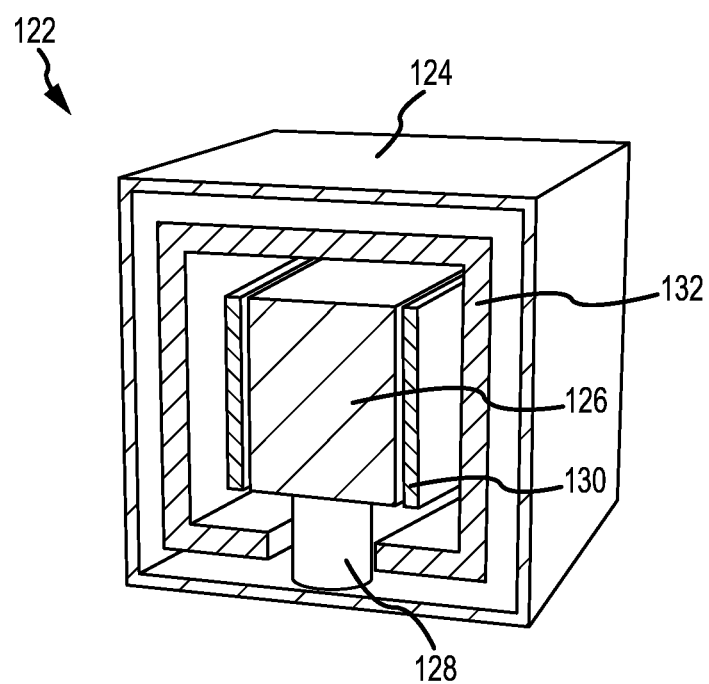
FIG. 3 illustrates a third example process for sapphire growth.

A system 122 for growing sapphire according to the VHGF process is illustrated in FIG. 3, with a cross-sectional view of a chamber 124. The chamber 124 surrounds an alumina charged crucible 126 into which a seed crystal is positioned at the bottom of the crucible. A heat sink 128 and heater 130 are each coupled to crucible 126 and an insulator 132 is provided within the chamber around the heater and crucible. The heater 130 melts the alumina in the crucible and the melted alumina is subsequently cooled by the heat sink 128 to form crystal in the shape of the crucible and following the orientation of the seed crystal. The seed crystal is positioned within the crucible so that the primary and secondary plane orientations provided for a high yield of the grown crystal. Once the crystal is cooled, the crucible 126 is cracked off and the crystal may be further processed (e.g., sliced, diced, polished, etc.).

Figure 4A:
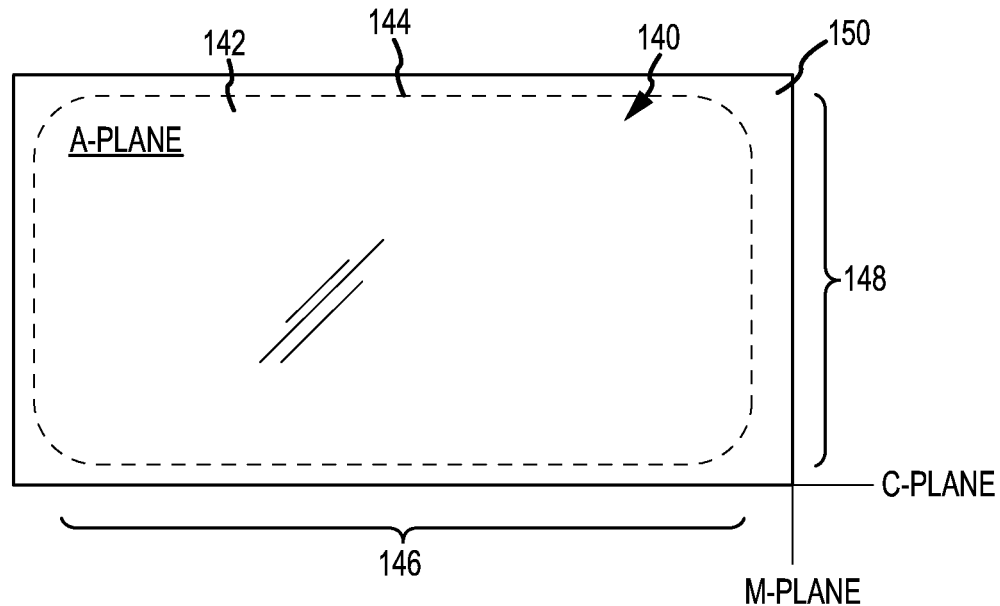
FIG. 4A illustrates a sapphire ribbon having selected primary and secondary crystallographic orientations.

FIG. 4A illustrates a sapphire ribbon 140 grown in accordance with one of the above-described growth processes. For example, the sapphire ribbon may have been grown in accordance with the EFG process. A seed crystal for the EFG growth process was oriented to yield a ribbon having a designated primary surface plane orientation, as well as an orientation for at least one edge. In particular, seed crystal was oriented so that the primary surface 142 primary surface has an A-plane crystallographic orientation. Additionally, long side 146 of the grown crystal 140 may have a C-plane crystallographic orientation. Further, a third surface (e.g., the short edge 148 of the ribbon 140) may have a desired crystallographic orientation, such as an M-plane crystallographic orientation.

Figure 4B:
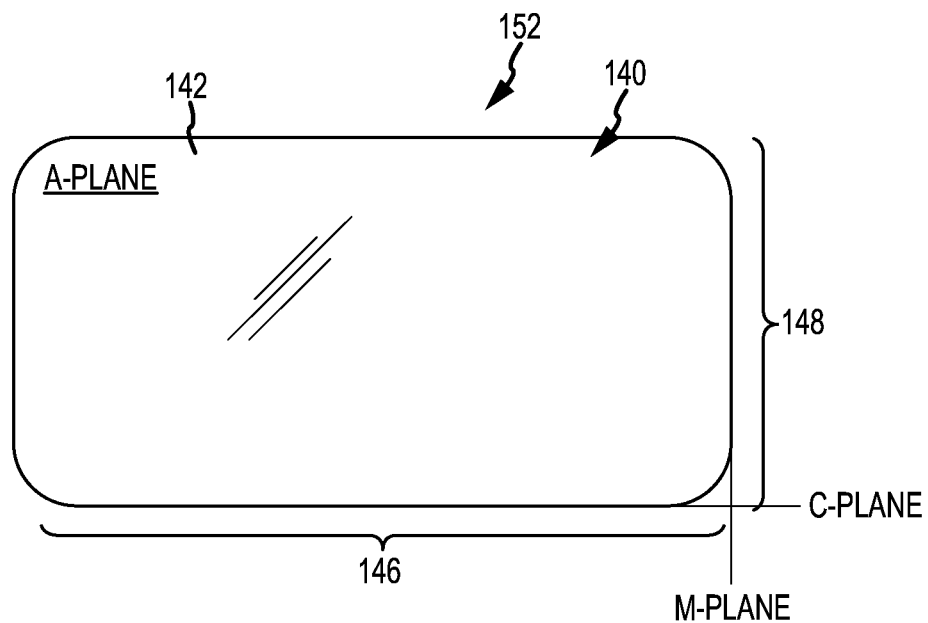
FIG. 4B illustrates a sapphire part having selected primary and secondary crystallographic orientations cut from the sapphire ribbon of FIG. 4A.

The orientation of the seed crystal during the growth process allows for a high yield of the grown crystal for a specific part. In particular, the dashed line 144 in FIG. 4A illustrates the cut line for a desired part. Specifically, the part may take the form of a cover glass 152 (illustrated in FIG. 4B) for an electronic device such as a smart phone, tablet computing device, and so forth. A portion 150 of the ribbon 150 that remains unused after cutting is minimized by specifically orienting the seed crystal to grow crystal with the desired crystallographic orientation. The high yield helps to reduce waste, thereby achieving efficiencies that help reduce costs.

It should be appreciated that the selection of the primary and secondary (or more) crystallographic orientations through orientation of the seed crystal may achieve orientations that are offset from the surface of the part. For example, a secondary crystallographic orientation may be offset by a desired angle to help avoid aligning low energy fracture planes with the highest stress directions of the part. Rather, the low energy fracture planes can instead be aligned with the directions of lowest stress.

Figure 5A:
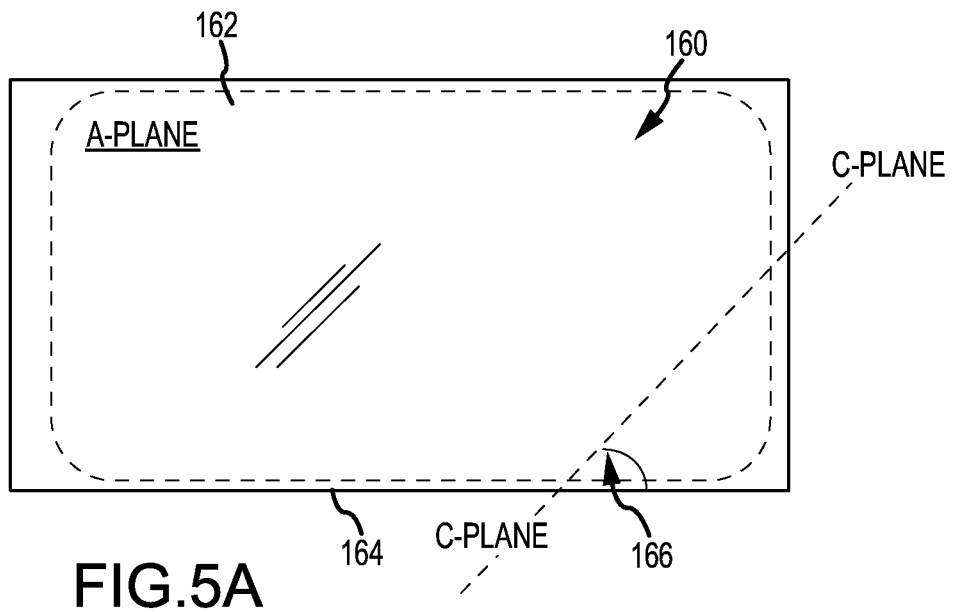
FIG. 5A illustrates another sapphire ribbon having selected primary and secondary orientations with the secondary orientation having an angle relative to at least one edge of the ribbon.
Figure 5B:
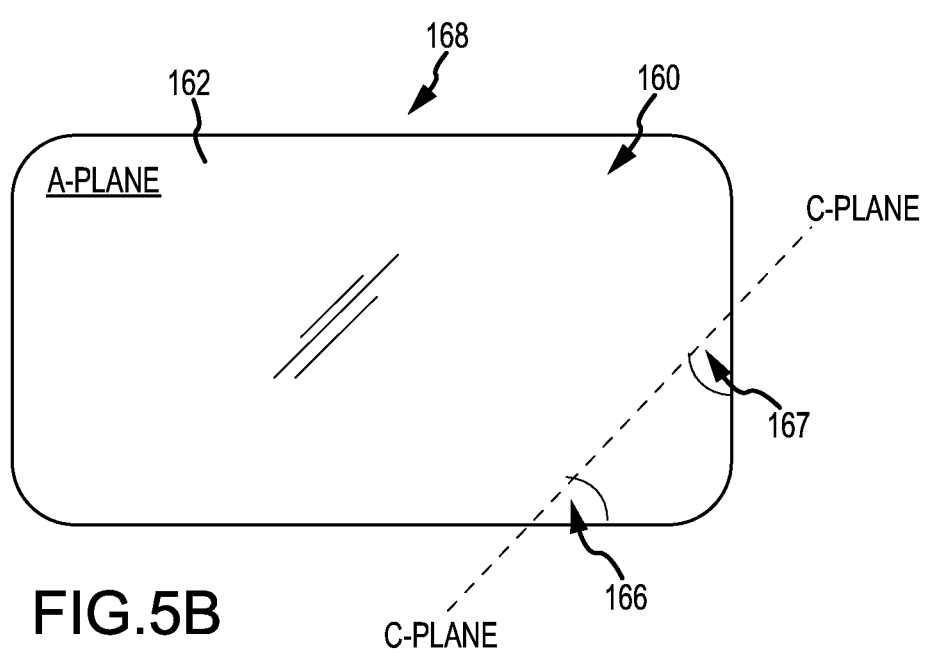
FIG. 5B illustrates another sapphire part having selected primary and secondary crystallographic orientations with the secondary crystallographic orientation having an offset angle relative to at least one edge of the sapphire part.

Turning to FIGS. 5A and 5B, the offset of the secondary crystallographic orientation is illustrated. Specifically, another sapphire ribbon 160 (e.g., grown through the EFG process) is illustrated having a primary crystallographic orientation providing a top surface 162 with an A-plane orientation. Additionally, a long side 164 of the ribbon 160 has a crystallographic orientation of an offset C-plane. That is, the C-plane crystallographic orientation is offset an angle 166 from the long side 162.

The offset angle 166 may be selected based on empirical data gathered that relates to low energy fracture planes. In particular, upon finding low energy fracture planes, the orientation of the crystallographic orientation may be adjusted to avoid the low energy fracture plane being exposed or particularly vulnerable along the long edge 164. In some embodiments, the offset angle 166 may be between approximately 5 and 85°. More specifically, the offset angle 166 may be between approximately 35° and 55°, such as approximately 45°.

As with the prior example, orienting the seed crystal before growth of the ribbon 160 results high yield sapphire production. That is the part 168 may constitute a large portion of the grown sapphire after it is cut from the ribbon 160. The part 168 has the desired primary and secondary crystallographic orientations. It should further be appreciated, that at least a third crystallographic orientation may be desirable and may be selected based on the seed crystal orientation. Specifically, an offset angle 167 relative to a short side of the part 168 may be selected.

In some embodiments, the offset angle 167 may be related to the offset angle 166 relative to the long side (e.g., because the offset angle is of the same crystallographic plane as that of the long side). In other embodiment, an offset angle relative to the short side may be related to a crystallographic orientation of a plane different from that of the long side. For example, rather than an offset of the C-plane relative to the short side, an offset relative to the M-plane may be set.

Figure 6:
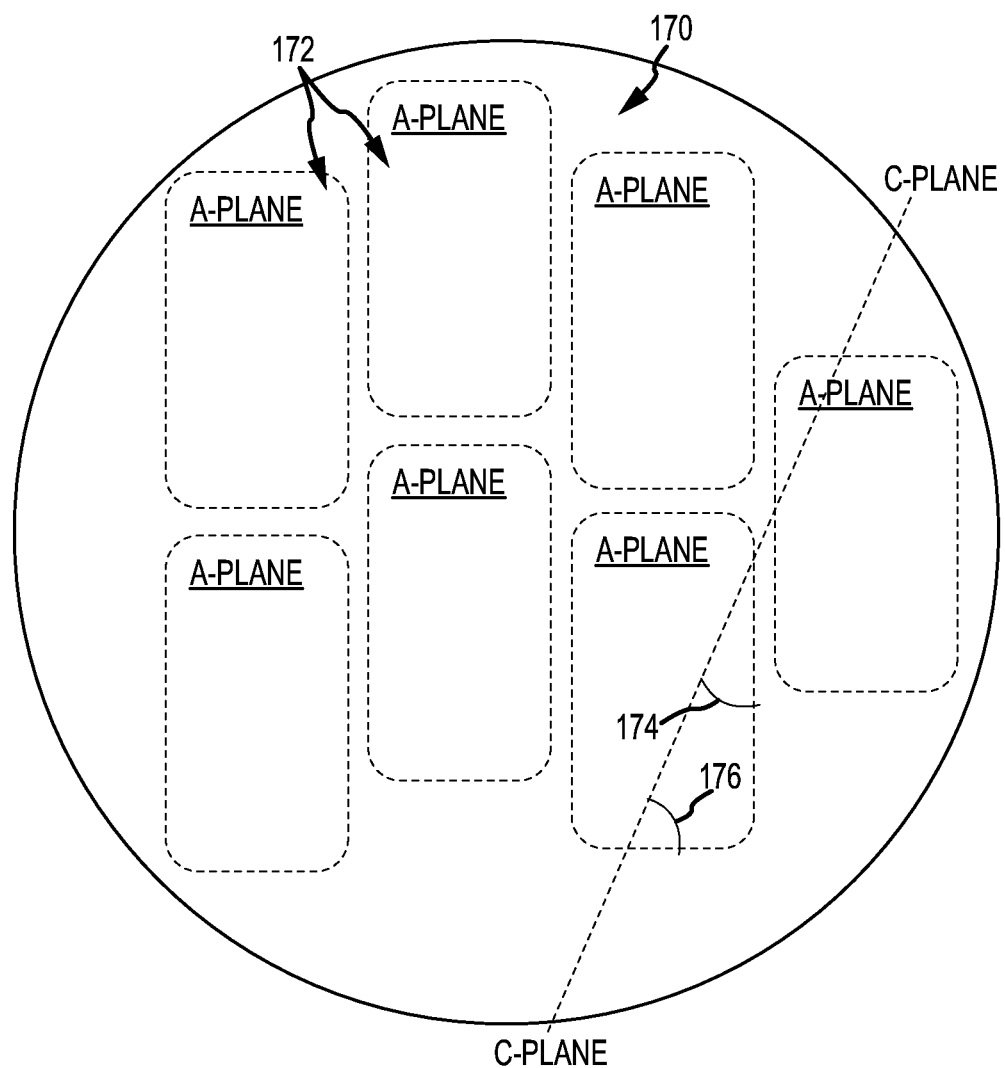
FIG. 6 illustrates a sapphire wafer with a desired primary crystallographic orientation and orienting cuts from the wafer based on a secondary orientation.

Orientation of the seed crystal prior to the growth of the crystal to achieve high yield of the crystal may be utilized in growth processes other than those that produce crystal ribbons or other flat crystal structures. In particular, the seed crystal for growth processes that yield crystal boule may be oriented to achieve high yields. Generally, the boule may be sliced into wafers that have a desired primary crystallographic orientation (such as an A-plane surface). Further, the wafer may be cut into discrete parts that achieve a desired secondary orientation. As shown in FIG. 6, a wafer 170 may have a surface with an A-plane crystallographic orientation. Parts 172 may be cut from the wafer 170 to achieve a desired secondary crystallographic orientation. For example, a long side and a short side of a part cut from the wafer may have desired offset angles 174, 176 from a C-plane.

Both the planes of crystallographic orientation, as well as the offset angles relative to the part, may be selected based at least in part upon the orientation of the seed crystal and the way the part is cut from the crystal. The crystallographic orientation and offset angles may provide specific characteristics that are desirable for the part. In particular, the crystallographic orientation may provide a desired strength to the part and or optical effects.

Figure 7:
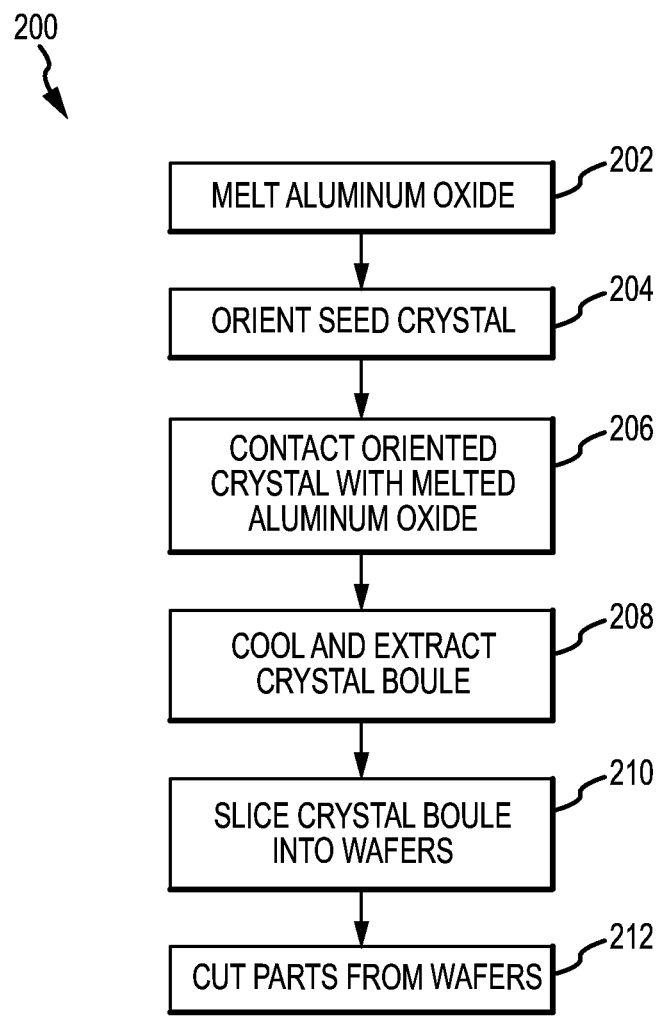
FIG. 7 is a flowchart illustrating an example method of creating sapphire parts having a desired primary and secondary crystallographic orientation.

FIG. 7 is a flowchart illustrating an example method 200 of producing a sapphire part in accordance with an example embodiment. Initially, aluminum oxide is heated and melted in a crucible (Block 202). A seed crystal is oriented to yield a desired crystallographic orientation in the grown crystal (Block 204). The seed crystal brought into contact with the melted aluminum oxide (Block 206) to propagate crystal growth having a desired crystallographic orientation. The crystal is cooled and removed from the crucible (Block 208). The crystal is sliced into wafers having a desired primary crystallographic orientation (Block 210) and parts are cut from the wafers to achieve a desired secondary crystallographic orientation (Block 212).

Figure 8:
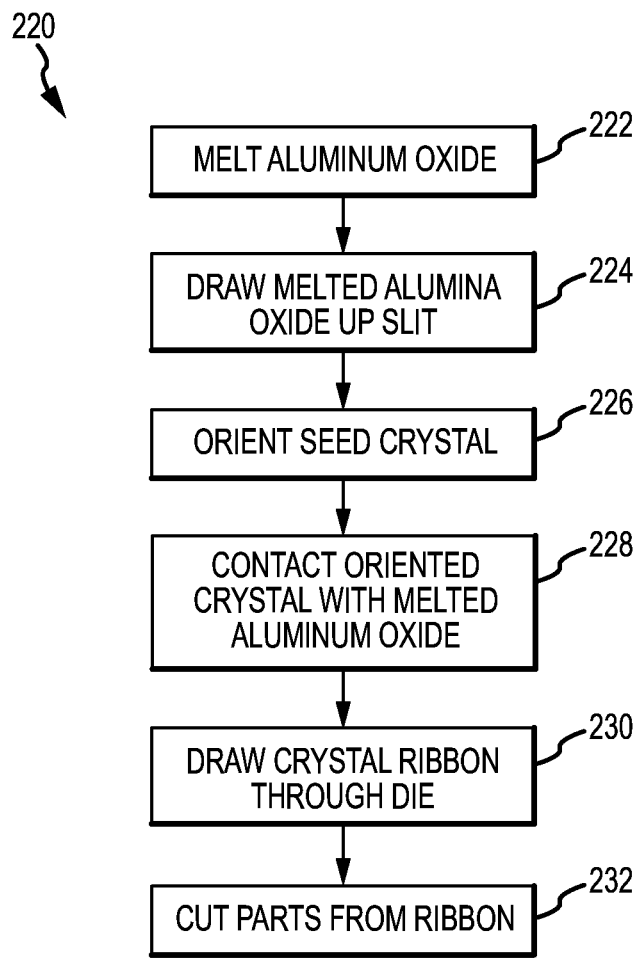
FIG. 8 is a flowchart illustrating another example method of creating sapphire parts having a desired primary and secondary crystallographic orientation.

FIG. 8 illustrates a method 220 for generating a sapphire part. The method includes heating and melting aluminum part (Block 222). The melted alumina is drawn up a slit (Block 224) by capillary action and into a shaping die. A seed crystal is oriented to produce a desired primary and secondary crystallographic orientation (Block 226). Sapphire crystal is drawn through the die (Block 228) having the desired primary and secondary crystallographic orientation. The crystal is cooled (Block 230) and one or more sapphire parts are cut from the sapphire crystal (Block 232).

It should be appreciated that alternative embodiments may include more or fewer steps and, additionally, that the processes of polishing, grinding and/or annealing may be part of the method 200 although not addressed herein.

Although the foregoing discussion has presented specific embodiments, persons skilled in the art will recognize that changes may be made in form and detail without departing from the spirit and scope of the embodiments. For example, crystallographic orientations that provide for planes other than those mentioned above by way of example may be implemented. Accordingly, the specific embodiments described herein should be understood as examples and not limiting the scope thereof.

We claim:

1. A method of manufacturing a cover glass having a crystalline structure comprising:
   melting aluminum oxide;
   drawing the melted aluminum oxide up a slit;
   orienting a seed crystal relative to a growth apparatus such that a crystalline structure grows having a predetermined primary crystallographic plane orientation and a predetermined secondary crystallographic plane orientation;
   pulling the crystalline structure as it forms to create a ribbon shaped crystalline structure having the predetermined primary crystallographic plane orientation at a major surface and the predetermined secondary crystallographic plane orientation at an offset angle from an edge, the offset angle based on the orientating of the seed crystal; and
   cutting a part from the crystalline structure to form the cover glass.

2. The method of claim 1, wherein:
   the determined primary plane orientation is an A-plane; and
   the determined secondary plane orientation is one of a C-plane, M-plane, or R-plane.

3. The method of claim 2, wherein the offset angle is between approximately 5 and 85 degrees relative to the edge of the crystalline structure.

4. The method of claim 2, wherein the offset angle is between approximately 35 and 55 degrees relative to the edge of the crystalline structure.

5. The method of claim 2, wherein the offset angle is approximately 45 degrees relative to the edge of the crystalline structure.

6. The method of claim 1, wherein the crystalline structure is grown by the growth apparatus to a size and a shape that corresponds to a size and a shape of the part.

7. The method of claim 1, wherein the growth apparatus grows the crystalline structure using one of:
an edge-defined film-fed growth; or
a horizontal moving growth method.

8. The method of claim 1, wherein:
the determined primary plane orientation is an M-plane; and
the determined secondary plane orientation is one of an A-plane, C-plane, or R-plane.

9. The method of claim 1, wherein:
the determined primary plane orientation is a C-plane; and
the determined secondary plane orientation is one of an A-plane, M-plane, or R-plane.

10. The method of claim 1, wherein:
the determined primary plane orientation is an R-plane; and
the determined secondary plane orientation is one of an A-plane, C-plane, or M-plane.

11. A method of manufacturing a device enclosure from sapphire comprising:
orientating a seed crystal such that a sapphire boule grows having a predetermined primary crystallographic orientation and a predetermined secondary crystallographic orientation;
slicing the sapphire boule to create a sapphire wafer having a major surface at the predetermined primary crystallographic orientation and an edge at an offset angle from the predetermined secondary crystallographic orientation; and
cutting a sapphire part from the wafer that forms at least a portion of the device enclosure, wherein the sapphire part is cut to have a surface at the offset angle from the predetermined secondary crystallographic orientation wherein the portion of the enclosure formed by the sapphire part is a cover glass.

12. The method of claim 11, wherein the offset angle is between 5 and 85 degrees relative to the surface of the sapphire part.

13. The method of claim 11, wherein the offset angle is approximately 45 degrees relative to the surface of the sapphire part.

14. The method of claim 11, wherein:
the surface is an edge of the part; and
the sapphire part is cut to have a major surface at the predetermined primary crystallographic plane orientation.

15. The method of claim 11, wherein:
the part is one of an array of parts;
the cutting comprises cutting the array of sapphire parts from the wafer; and
each of the array of sapphire parts is cut to have a surface at the offset angle from the predetermined secondary plane orientation.

16. The method of claim 12, wherein the offset angle corresponds to a low energy fracture plane of the sapphire boule.

* * * * *